US006862548B1

(12) United States Patent
Chan

(10) Patent No.: US 6,862,548 B1
(45) Date of Patent: Mar. 1, 2005

(54) METHODS AND CIRCUITS FOR MEASURING CLOCK SKEW ON PROGRAMMABLE LOGIC DEVICES

(75) Inventor: Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 151 days.

(21) Appl. No.: 10/021,447

(22) Filed: Oct. 30, 2001

(51) Int. Cl.[7] .................... G01M 19/00; G06F 19/00
(52) U.S. Cl. .................. 702/125; 702/117; 374/170; 340/870.16; 324/765; 712/10; 712/15; 327/156; 327/159; 327/160; 710/305; 710/306; 710/308; 710/309
(58) Field of Search .................. 702/117, 125; 374/170; 340/870.16; 324/765; 326/40; 365/230.03; 331/57; 327/156–160; 710/305–309; 712/10, 15

(56) References Cited

U.S. PATENT DOCUMENTS

| | | | | |
|---|---|---|---|---|
| 5,497,109 A | * | 3/1996 | Honda et al. ............ | 326/93 |
| 5,795,068 A | * | 8/1998 | Conn, Jr. ................ | 374/170 |
| 5,933,023 A | * | 8/1999 | Young .................... | 326/40 |
| 6,002,991 A | * | 12/1999 | Conn, Jr. ................ | 702/117 |
| 6,144,220 A | | 11/2000 | Young | |
| 6,144,262 A | * | 11/2000 | Kingsley ................. | 331/57 |
| 6,369,624 B1 | * | 4/2002 | Wang et al. ............. | 327/156 |
| 6,404,693 B1 | * | 6/2002 | Choi et al. ............. | 365/230.03 |
| 6,467,009 B1 | * | 10/2002 | Winegarden et al. ...... | 710/305 |
| 6,507,209 B1 | * | 1/2003 | Jones ................... | 324/765 |
| 6,617,884 B2 | * | 9/2003 | Wang et al. ............. | 327/12 |
| 2002/0075163 A1 | * | 6/2002 | Smith et al. ........... | 340/870.16 |

OTHER PUBLICATIONS

U.S. Appl. No. 10/021,448, filed Oct. 30, 2001, Chan.

* cited by examiner

Primary Examiner—John Barlow
Assistant Examiner—Aditya Bhat
(74) Attorney, Agent, or Firm—Arthur J. Behiel; Edel M. Young; Justin Liu

(57) ABSTRACT

Described are methods for accurately measuring the skew of clock distribution networks on programmable logic devices. Clock distribution networks are modeled using a sequence of oscillators formed on the device using configurable logic. Each oscillator includes a portion of the network, and consequently oscillates at a frequency that depends on the signal propagation delay associated with the included portion of the network. The various oscillator configurations are defined mathematically as the sum of a series of delays, with the period of each oscillator representing the sum. The respective equations of the oscillators are combined to solve for the delay contribution of the included portion of the clock network. The delay associated with the included portion of the clock network can be combined with similar measurements for other portions of the clock network to more completely describe the network.

17 Claims, 5 Drawing Sheets

METHODS AND CIRCUITS FOR MEASURING CLOCK SKEW ON PROGRAMMABLE LOGIC DEVICES

FIELD OF THE INVENTION

This invention relates generally to methods and circuit configurations for measuring signal skew in programmable logic devices.

BACKGROUND

Programmable logic devices (PLDs) are a well-known type of digital integrated circuit that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic is personalized by loading configuration data into internal configuration memory cells that define how the CLBs, interconnections, and IOBs are configured. For a detailed discussion of an exemplary FPGA, see U.S. Pat. No. 6,144,220 entitled "FPGA Architecture Using Multiplexers that Incorporate a Logic Gate," by Steven P. Young, which is incorporated herein by reference.

FIG. 1 (Prior Art) depicts a conventional FPGA 100, examples of which include the Spartan™ and Virtex™ FPGAs available from Xilinx, Inc., of San Jose, Calif. FPGA 100 includes an array of programmably interconnected CLBs 105. FPGA 100 additionally includes a clock distribution network 110 that can be connected to internal or external clock sources via a global clock buffer BUFG. Many other FPGA resources are omitted from FIG. 1 for brevity.

Manufacturers of PLDS, including FPGAs, would like to guarantee the highest speed performance possible without their devices failing to meet timing specifications. PLD designers therefore measure circuit timing as accurately as possible to minimize the guard bands required to ensure correct device performance. U.S. Pat. No. 6,144,262 entitled "Circuit for Measuring Signal Delays of Asynchronous Register Inputs," by Christopher Kingsley describes circuits and methods of measuring circuit timing in programmable logic devices, and is incorporated herein by reference. U.S. Pat. No. 5,795,068 entitled "Method and Apparatus for Measuring Localized Temperatures and Voltages on Integrated Circuits," by Robert O. Conn describes ring oscillator configurations on FPGAs, and is also incorporated herein by reference.

Clock distribution network 110 includes a source spine 110S that conveys clock signals to a source node 112 in the interior of FPGA 100. From there, a horizontal spine 110H conveys clock signals to a number of vertical clock spines 110V. Finally, a number of clock destination branches 110D extend to each CLB 105. Clock distribution network 110 can be programmably connected to any of CLBs 105 via programmable interconnect points. The above-cited Young patent describes exemplary programming technologies.

Clock distribution network 110 typically includes clock buffers 115 placed and sized to minimize clock skew, where skew is defined as the difference in path delays from clock input GCLK to each of CLBs 105 and any other clock loads, such as embedded blocks of memory and IOBs. Many different buffer and conductor configurations are possible, the selected implementation depending upon design requirements.

High-performance clock distribution networks, such as network 110, are designed to minimized clock skew. The delays inherent in network 110 are typically short relative to the delays associated with other FPGA resources. The short skew is beneficial from the standpoint of performance, but renders difficult the task of accurately determining clock skew because conventional test circuitry normally introduces more skew than the clock distribution network. There is therefore a need for a more accurate means of measuring skew on programmable logic devices.

SUMMARY

The present invention is directed to a method for accurately measuring the skew of clock distribution networks on programmable logic devices. Individual clock distribution networks are modeled using a sequence of delay-element configurations formed on the device using configurable logic. Each delay element includes a portion of the clock network for which skew is of interest, and consequently exhibits a delay that depends, in part, on the skew imposed by the portion of interest. The delay through each delay element is measured by incorporating the delay elements into ring oscillators and measuring the resulting period.

The various delay-element configurations are modeled mathematically as the sum of a series of delays. The delay-element configurations are designed so their respective equations can be combined to solve for the delay contribution, or skew, of the portion of the clock network for which skew is to be measured. The delay associated with the portion of interest can then be combined with skew measurements for other portions of the clock network to more completely describe the network.

The claims, and not this summary, define the scope of the invention.

DETAILED DESCRIPTION

Figure 1:
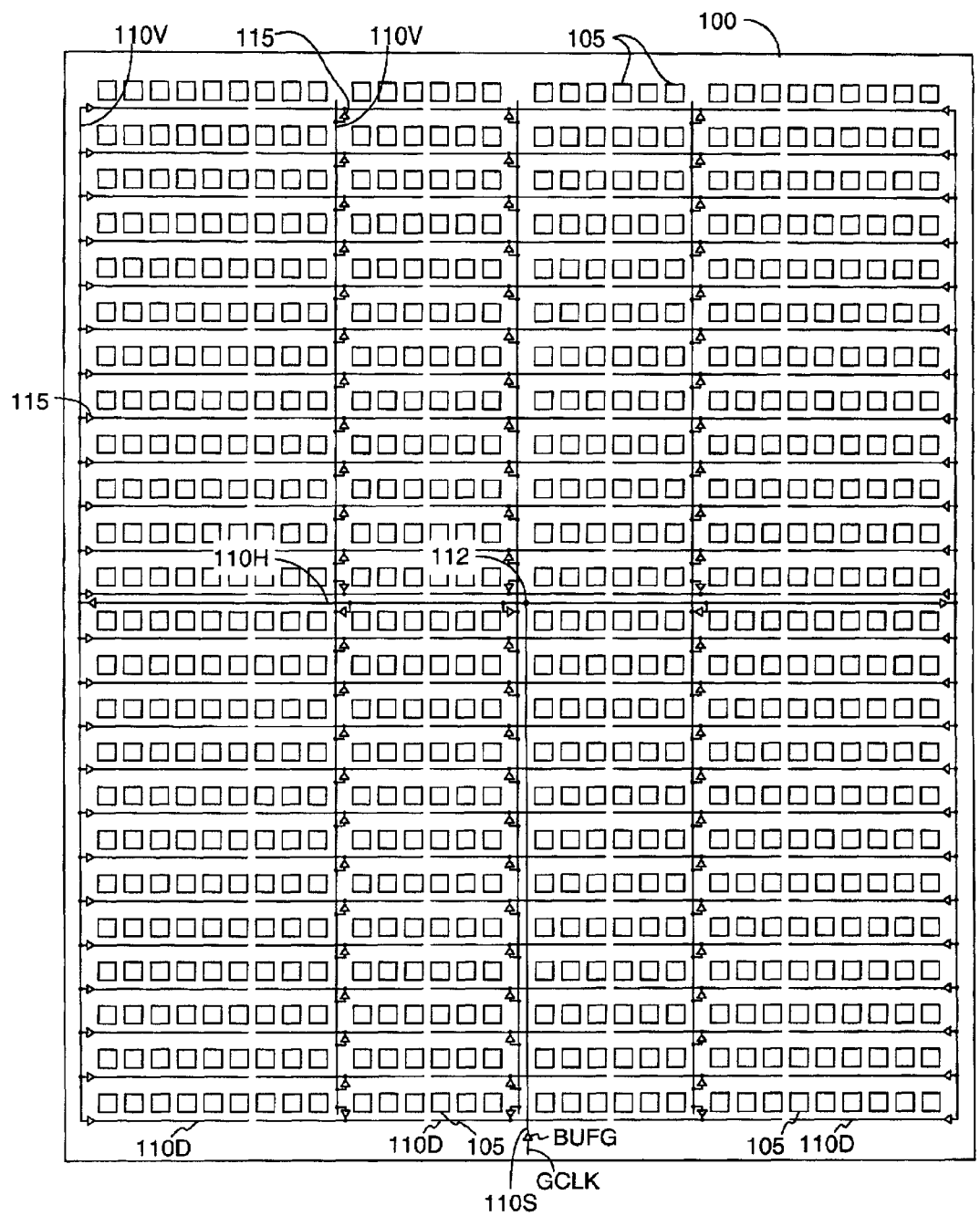
FIG. 1 (Prior Art) depicts a conventional FPGA 100.

FIGS. 2–5 schematically depict FPGA configurations used in accordance with embodiments of the invention to accurately measure global clock skew for clock distribution network 110 of FIG. 1. In the examples, the FPGA is a Virtex™ XCV1000 FPGA, available from Xilinx, Inc., which includes an array of 96 columns and 64 rows of CLBs, or a total of 6,144 CLBs. The number of CLBs and other FPGA resources shown in the figures is limited for brevity.

Figure 2:
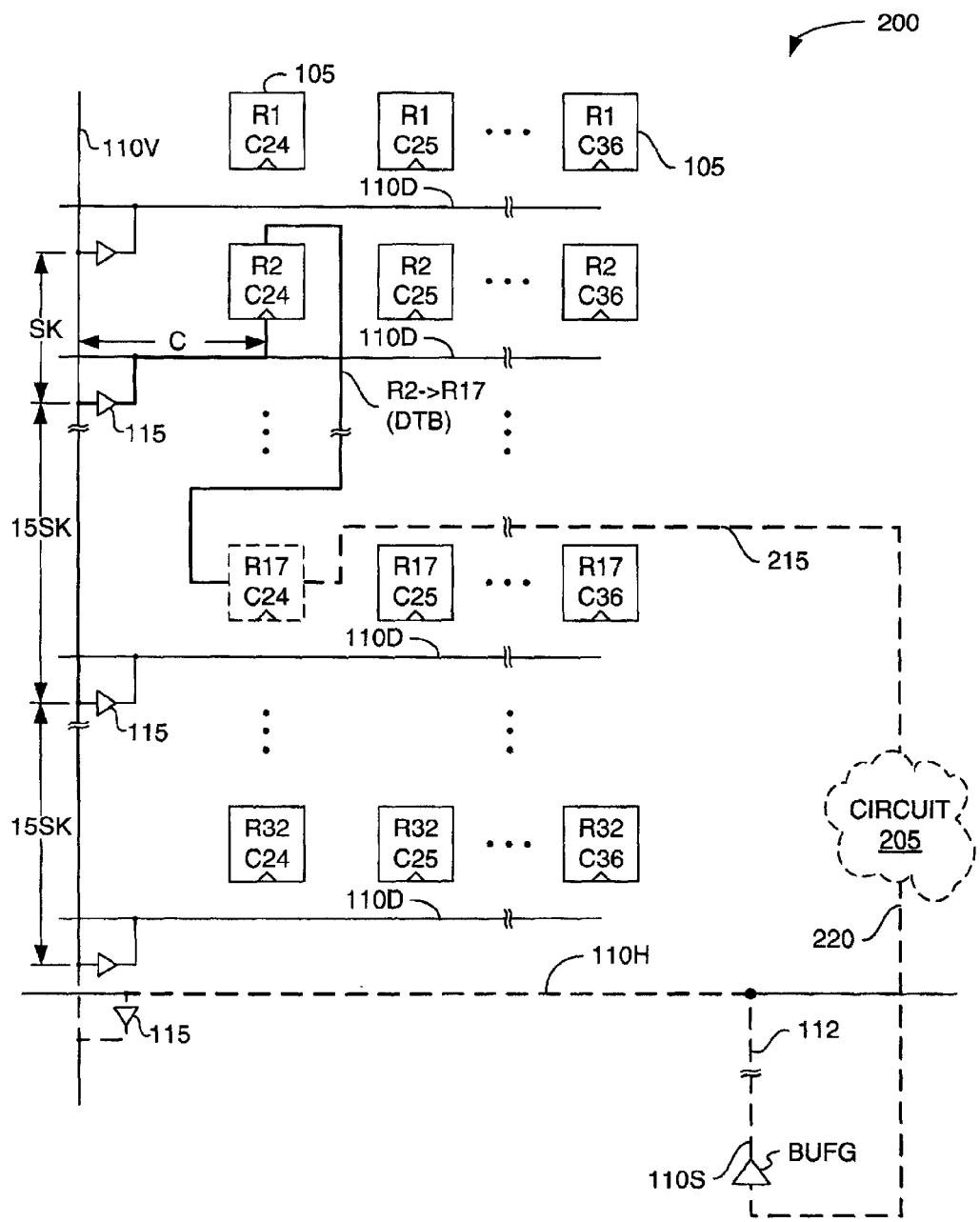
FIG. 2 depicts an FPGA oscillator configuration 200.

FIG. 2 depicts an FPGA oscillator configuration 200 in which a CLB R2C24 (for row 2, column 24), a CLB R17C24, and a feedback circuit 205 are interconnected to form a ring oscillator. Circuit 205 and the associated connections 215 and 220 are made of available FPGA resources and connect to clock distribution network 110 via global clock buffer BUFG. The resources interconnected as shown using dashed and bold interconnect and clock lines form the ring oscillator.

The FPGA is programmed (i.e., configured) so the global clock buffer BUFG connects to the clock input terminal of CLB R2C24 via source spine 110S, horizontal clock spine 110H, a vertical clock spine 110V, and one of destination branches 110D. The synchronous output terminal of CLB R2C24 is programmably connected to an asynchronous input terminal of CLB R17C24 via some programmable interconnect resources R2→R17, so called because the routing connects row 2 to row 17. Finally, an output terminal of CLB R17C24 is programmably connected to the input terminal of global buffer BUFG via programmable interconnect resources 215 and 220 and circuit 205.

As oscillator configuration 200 oscillates, the oscillation period $T_{200}$ provides a measure of the speed of the interconnected components. For example, if the average period $T_{200}$ of configuration 200 is ten nanoseconds, then the average time required for positive- and negative-going signal transitions to traverse the ring of components is ten nanoseconds. The above-incorporated Kingsley patent describes some oscillators for use with the present invention.

The delay around the path of oscillator 200 is the sum of the delays associated with vertical spine 110V, a one-column-long portion of a destination branch 110D, the clock-to-out (Clk→Out) delay of CLB R2C24, the interconnect delay of net R2→R17, and the combined delays K of the delays imposed by CLB R2C24, connections 215 and 220, circuit 205, buffer BUFG, and source spine 110S. The delay analysis can be simplified by assuming nearby CLBs exhibit identical clock-to-out (clk→Out) delays. This is a reasonable assumption for identical components formed in close proximity.

Stated mathematically, the oscillation period $T_{200}$ of oscillator configuration 200 is:

$$T_{200}=30SK+C+\text{Clk}\rightarrow\text{Out}+DTB+K \quad (1)$$

where SK is the skew imposed by spine 110V between adjacent clock destination branches 110D, C is the delay associated with a one-column-long portion of a branch 110D, Clk→Out is the clock-to-out delay of a CLB, DTB is the delay encountered by signals traveling from top-to-bottom from row 2 to row 17 along net R2→R17, and K is the delay associated with that portion of oscillator configuration 200 depicted using dashed lines. Nets described herein as having identical delays are defined using device programming software to establish identical or substantially identical routes, and therefore to impose identical or substantially identical delays. The process or forcing device programming software to select specific routing paths is well understood by those of skill in the art of defining circuit configurations for programmable logic devices.

The oscillation period $T_{200}$ of configuration 200 is generally not, by itself, enough information to determine the delay associated with any one of the components of the ring. The FPGA is therefore reconfigured to form one or more additional test structures.

Figure 3:
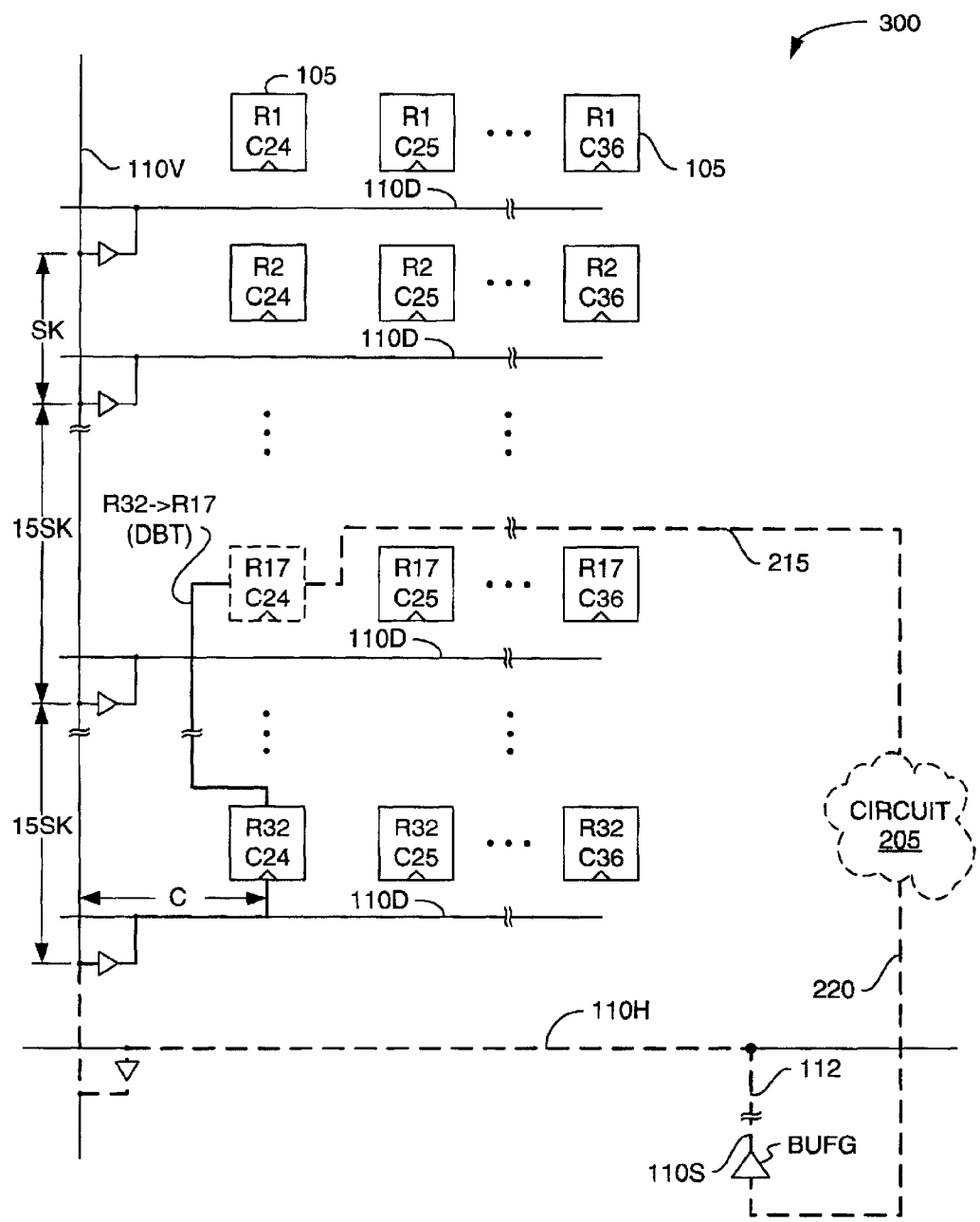
FIG. 3 depicts an FPGA oscillator configuration 300.

FIG. 3 depicts an FPGA configuration 300 in which CLB R2C24, CLB R32C24, global clock buffer BUFG, and the identical circuit 205 of FIG. 2 are interconnected to form a second ring oscillator. CLB R2C24, circuit 205, clock buffer BUFG, and the dashed portion of clock distribution network 110 and interconnect resources 215 and 220 are identical to the like-identified structures of FIG. 2; consequently, the sum of the combined delay contributions of those dashed elements, "K" in equation 1, is identical in oscillator configurations 200 and 300. The portions of the oscillators depicted as connected via solid lines in the figures can be considered delay elements for which the difference in signal propagation delays provides a measure of clock skew. Including the delay elements in ring oscillators allows for accurate measures of propagation delay through the delay element.

The FPGA of FIG. 3 is programmed so the clock input terminal of CLB R32C24 connects to the output terminal of global clock buffer BUFG via a one-column long portion of one of destination branches 110D, vertical spine 110V, horizontal spine 110H, and one of source spines 110S. The synchronous output terminal of CLB R32C24 is programmably connected to an input terminal of CLB R17C24 via some programmable interconnect resources R32→R17. Finally, as in configuration 200, an output terminal of CLB R17C24 is programmably connected to the input terminal of global buffer BUFG via programmable interconnect resources 215 and 220 and circuit 205. The dashed portions of oscillator configurations 200 and 300 are identical, each imposing a delay K.

Stated mathematically, the oscillation period $T_{300}$ of oscillator configuration 300 is:

$$T_{300}=C+\text{Clk}\rightarrow\text{Out}+DBT+K \quad (2)$$

where C is the delay associated with a one-column-long portion of a branch 110D, Clk→Out is the clock-to-out delay of CLB R32C24, DBT is the delay encountered by signals traveling from bottom-to-top from row 32 to row 17 along net R32→R17, and K is the delay associated with that portion of oscillator configuration 300 depicted using dashed lines, including the delay induced by CLB R2C24.

Comparing periods $T_{200}$ and $T_{300}$ of respective configurations 200 and 300 provides a measure of the skew SK between adjacent destination branches. Subtracting equation 2 from equation 1 gives:

$$\begin{aligned} T_{200}-T_{300} &= (30SK+C+\text{Clk}\rightarrow\text{Out}+DTB+K)- \\ &\quad (C+\text{Clk}\rightarrow\text{Out}+DBT+K) \\ &= 30SK+DTB-DBT \end{aligned} \quad (3)$$

Solving for skew SK provides:

$$SK=(T_{200}-T_{300}+DBT-DTB)/30 \quad (4)$$

Different programmable logic devices route differently For a given PLD, the values of delays DBT and DTB may be close enough to assume they cancel one another. This assumption reduces equation 4 to:

$$SK=(T_{200}-T_{300})/30 \quad (5)$$

Thus, if DTB and DBT are equal, periods $T_{200}$ and $T_{250}$ are measures of skew SK. Of course, skew SK can also be used to find the skew between non-adjacent destination branches 110D; for example, the skew between destination branches separated by a row of CLBs would be 2SK.

It may be difficult or impossible to route some PLDs such that the top-to-bottom connections (e.g., net R2→R17) provide the same delays as the bottom-to-top connections (e.g., net R32→R17). In such cases, equation 4 cannot be simplified to equation 5.

Figure 4:
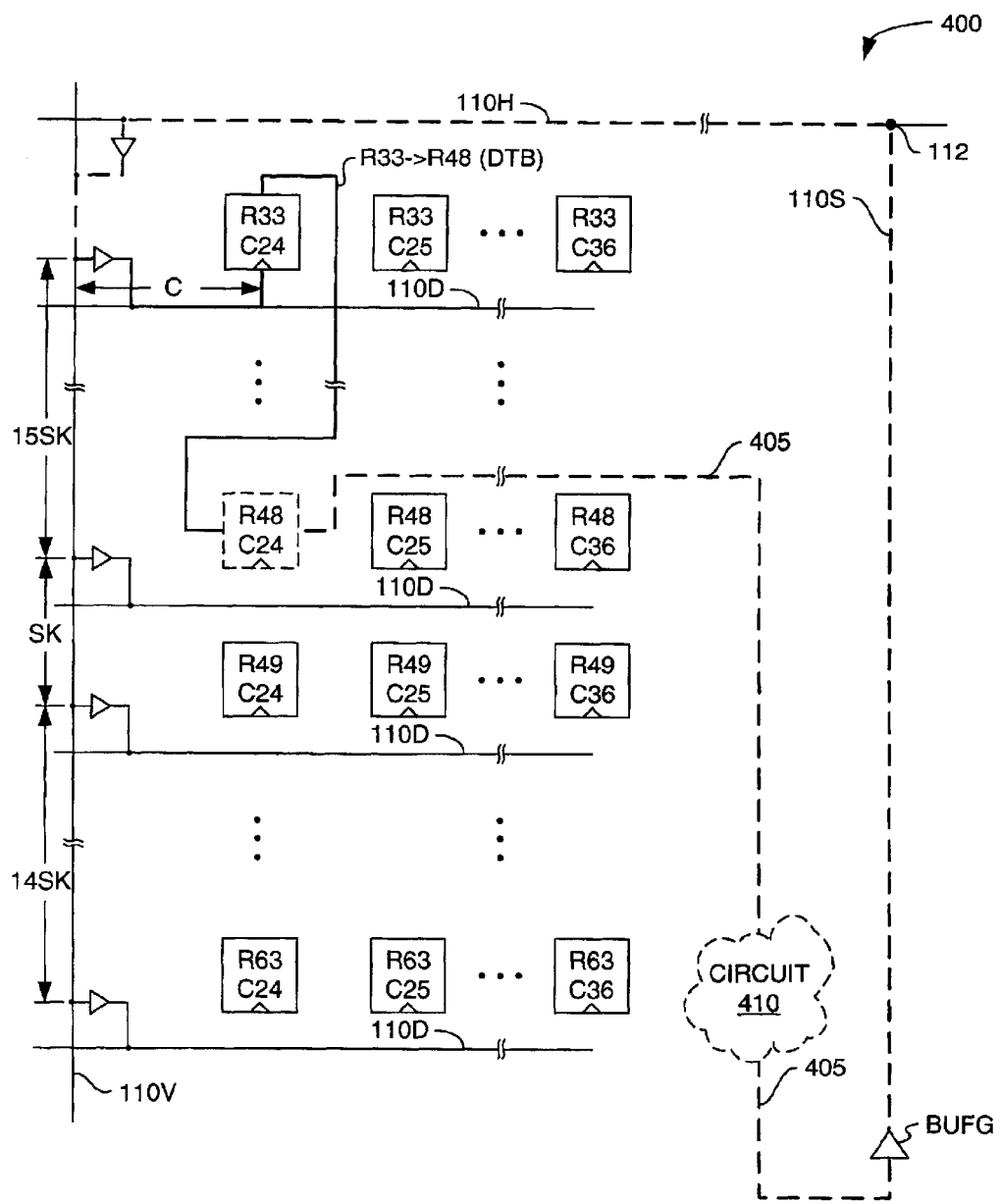
FIG. 4 depicts an FPGA oscillator configuration 400.
Figure 5:
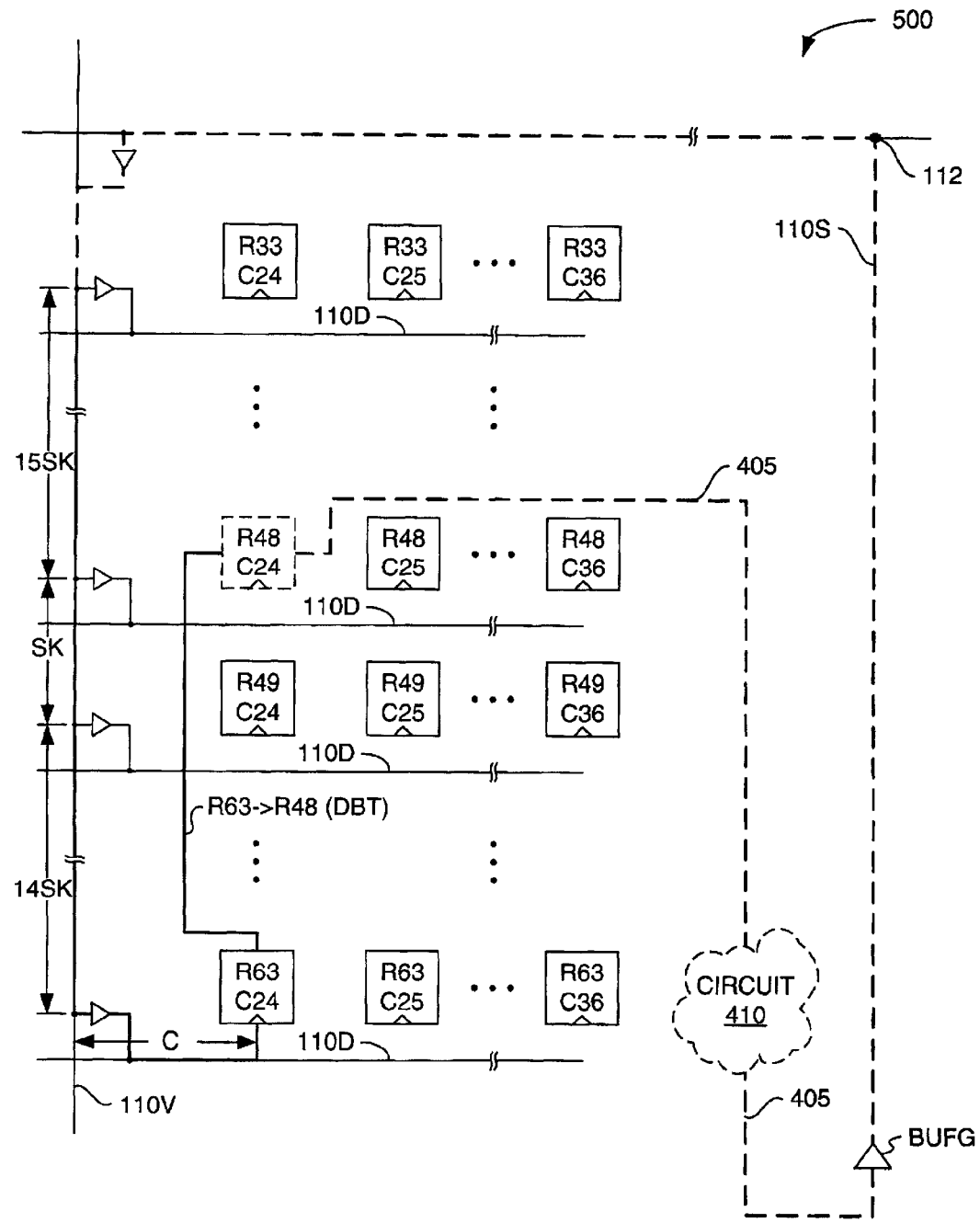
FIG. 5 depicts an FPGA oscillator configuration 500.

FIGS. 4 and 5 depict respective oscillator configurations 400 and 500, the periods of which provide additional data for finding the skew SK between adjacent destination branches 110D in the event of unequal top-to-bottom and bottom-to-top delays DTB and DBT. As with the preceding figures, the dashed and bold lines indicate which components form the oscillators. The dashed lines 405, CLB R48C24, and feedback circuit 410 are identical circuit configurations in both FIGS. 4 and 5, and their equivalent delay contributions are symbolized by a constant M. The ring oscillators in each of FIGS. 4 and 5 can be configured as described in the above-incorporated Kingsley patent. In the depicted embodiment, CLB R48C24 is configured to be an asynchronous inverter, though different asynchronous or synchronous configurations might also be used. Circuit 410 and the associated connections 405 are made of available FPGA resources and connect to clock distribution network 110 via global clock buffer BUFG.

The FPGA of FIGS. 2 through 4 is configured such that net R33→R48 of configuration 400 (FIG. 4) is identical to net R2→R17 of oscillator configuration 200 (FIG. 2) so the delays DTB associated with these nets are identical, or nearly so. Likewise, net R63→R48 (FIG. 5) is identical to net R32→R17 (FIG. 3) so the delays DBT associated with these nets are identical.

Using the same method described above for determining the periods associated with oscillator configurations 200 and 300, the respective periods $T_{400}$ and $T_{500}$ of oscillator configurations 400 and 500 are:

$$T_{400} = C + Clk \rightarrow Out + DTB + M \quad (6)$$

and $$T_{500} = 30SK + C + Clk \rightarrow Out + DBT + M \quad (7)$$

Subtracting equation 6 from equation 7 gives:

$$T_{500} - T_{400} = (30SK + C + Clk \rightarrow Out + DBT + M) - \quad (8)$$
$$(C + Clk \rightarrow Out + DTB + M)$$
$$= 30SK + DBT - DTB$$

Solving for DBT−DTB gives:

$$DBT - DTB = T_{500} - T_{400} - 30SK \quad (9)$$

Oscillator configurations 400 and 500 thus provide a measure of the difference in delays between bottom-to-top and top-to-bottom programmable interconnections between rows of CLBs.

The result of equation 9, DBT-DTB, can be used to solve for skew SK using equation 4 as follows:

$$SK = (T_{200} - T_{300} + T_{500} - T_{400} - 30SK)/30 \quad (10)$$

or $$SK = (T_{200} - T_{300} + T_{500} - T_{400})/60 \quad (11)$$

Thus, the four oscillator configurations depicted in FIGS. 2–5 collectively provide enough information to determine the skew SK between adjacent destination branches 110D.

Skew measurements between vertical clock spines 110V may also be of interest, and can be combined with the above-described skew measurements to give a comprehensive skew analysis for an entire device. Patent application Ser. No. 10/021,448 entitled "METHODS AND CIRCUITS FOR MEASURING CLOCK SKEW ON PROGRAMMABLE LOGIC DEVICES," by Siuki Chan, filed herewith describes methods of measuring skew between vertical clock spines and is incorporated herein by reference.

FPGA components are connected in various ways: some components are directly connected, others are connected via intermediate components, such as buffers, and still others are programmably connectable, which is to say they can be programmably connected via programmable interconnect resources. In each instance, components are connected to establish some desired electrical communication between two or more circuit nodes, or terminals. Such communication may typically be accomplished using a number of circuit configurations, as will be understood by those of skill in the art.

While the present invention has been described in connection with specific embodiments, variations of these embodiments will be obvious to those of ordinary skill in the art. For example, multiple embodiments of the above-described oscillator configurations can be used simultaneously on devices that include more than one signal tree for which skew measurements are of interest. Moreover, above-described skew measurements can be done in any order and other columns of CLBs (e.g., column 25 of FIGS. 2–5) could be used to perform skew measurements. Therefore, the spirit and scope of the appended claims should not be limited to the foregoing description.

What is claimed is:

1. A method comprising:
   instantiating a first delay element on a programmable logic device, the device including a signal tree having a source node connected to first, second, and third destination branches, and first, second, and third logic blocks programmably connectable to the respective first, second, and third destination branches, each of the logic blocks having an input terminal and an output terminal, using a first programming sequence that includes:
      connecting the first destination branch to the input terminal of the first logic block; and
      connecting the output terminal of the first logic block to the input terminal of the second logic block;
   instantiating a second delay element on the device using a second programming sequence that includes:
      connecting the third destination branch to the input terminal of the third logic block; and
      connecting the output terminal of the third logic block to the input terminal of the second logic block: and
   measuring signal skew on the programmable logic device through the signal tree based on a difference in delay between the first and second delay elements.

2. The method of claim 1, wherein the signal tree is a clock tree.

3. The method of claim 1, wherein the input terminal of the second logic block is an asynchronous input terminal.

4. The method of claim 1, wherein the first, second, and third logic blocks are arranged on the device in a column.

5. The method of claim 4, wherein the second logic block is physically between the first and third logic blocks.

6. The method of claim 1, wherein the source node is further connected to fourth, fifth, and sixth destination branches and the programmable logic device further includes fourth, fifth, and sixth logic blocks programmably connectable to the respective fourth, fifth, and sixth destination branches, each of the logic blocks having an input terminal and an output terminal, the method further comprising:
   instantiating a third delay element on the device using a third programming sequence that includes:
      connecting the fourth destination branch to the input terminal of the fourth logic block; and
      connecting the output terminal of the fourth logic block to the input terminal of the fifth logic block;
   a instantiating a fourth delay element on the device using a fourth programming sequence that includes:
      connecting the sixth destination branch to the input terminal of the sixth logic block; and
      connecting the output terminal of the sixth logic block to the input terminal of the fifth logic block; and measuring signal skew on the programmable logic device through the signal tree based on differences in delay between at least two of the first, second, third, and fourth delay elements.

7. A method of measuring signal skew on a programmable logic device, the device including a signal tree having a source node connected to first, second, and third destination branches, first, second, and third logic blocks programmably connectable to the respective first, second, and third destination branches, each of the logic blocks having an input terminal and an output terminal, wherein the source node is further connected to fourth, fifth, and sixth destination branches and the programmable logic device further includes fourth, fifth, and sixth logic blocks programmably connectable to the respective fourth, fifth, and sixth destination branches, each of the logic blocks having an input terminal and an output terminal, the method comprising:

instantiating a first delay element on the device using a first programming sequence that includes:
an connecting the first destination branch to the input terminal of the first logic block; and
connecting the output terminal of the first logic block to the input terminal of the second logic block;

by instantiating a second delay element on the device using a second programming sequence that includes:
connecting the third destination branch to the input terminal of the third logic block; and
connecting the output terminal of the third logic block to the input terminal of the second logic block instantiating a third delay element on the device using a third programming sequence that includes:
connecting the fourth destination branch to the input terminal of the fourth logic block; and
connecting the output terminal of the fourth logic block to the input terminal of the fifth logic block; and instantiating a fourth delay element on the device using a fourth programming sequence that includes:
connecting the sixth destination branch to the input terminal of the sixth logic block; and
connecting the output terminal of the sixth logic block to the input terminal of the fifth logic block, wherein connecting the output terminal of the first logic block to the input terminal of the second logic block establishes a first net, connecting the output terminal of the second logic block to the input terminal of the second logic block establishes a second net, connecting the output terminal of the fourth logic block to the input terminal of the fifth logic block establishes a third net, and connecting the output terminal of the sixth logic block to the input terminal of the fifth logic block establishes a fourth net, the method further comprising defining the first and third nets to be identical and defining the second and fourth nets to be identical.

8. The method of claim 1, further comprising configuring the device to include the first and second delay elements in respective first and second oscillators.

9. The method of claim 8, further comprising comparing the periods of the first and second oscillators.

10. A method comprising:
programming a programmable logic device, the programmable logic device including a clock-distribution network having a source node connected to first, second, and third destination branches, and first, second, and third programmable logic blocks programmable connectable to the respective first, second, and third destination branches, each of the programmable logic blocks having an input terminal and an output terminal, to include a first ring oscillator in which the first destination branch is connected to the input terminal of the first logic block and the output terminal of the first logic block is connected to the input terminal of the second logic block;

after programming the programmable logic device to include the first ring oscillator, programming the programmable logic device to include a second ring oscillator in which the third destination branch is connected to the input terminal of the third logic block and the output terminal of the third logic block is connected to the input terminal of the second logic block; and measuring clock skew on the programmable logic device through the clock-distribution network based on a difference between oscillation period of the first ring oscillator and oscillation period of the second ring oscillator.

11. The method of claim 10, wherein the input terminal of the second logic block is an asynchronous input terminal.

12. The method of claim 10, wherein the first, second, and third logic blocks are arranged on the programmable logic device in a column.

13. The method of claim 12, wherein the second logic block is physically between the first and third logic blocks.

14. The method of claim 10, wherein the source node is further connected to fourth, fifth, and sixth destination branches and the programmable logic device further includes fourth, fifth, and sixth programmable logic blocks programmably connectable to the respective fourth, fifth, and sixth destination branches, each of the programmable logic blocks having an input terminal and an output terminal, the method further comprising:

programming the programmable logic device to include a third ring oscillator in which the fourth destination branch is connected to the input terminal of the fourth logic block and the output terminal of the fourth logic block is connected to the input terminal of the fifth logic block;

programming the programmable logic device to include a fourth ring oscillator in which the sixth destination branch is connected to the input terminal of the sixth logic block and the output terminal of the sixth logic block to the input terminal of the fifth logic block; and measuring clock skew on the programmable logic device through the clock-distribution network based on differences in oscillation period between at least two of the first, second, third, and fourth ring oscillators.

15. The method of claim 14, wherein connecting the output terminal of the first logic block to the input terminal of the second logic block establishes a first net, connecting the output terminal of the second logic block to the input terminal of the second logic block establishes a second net, connecting the output terminal of the fourth logic block to the input terminal of the fifth logic block establishes a third net, and connecting the output terminal of the sixth logic block to the input terminal of the fifth logic block establishes a fourth net, the method further comprising defining the first and third nets to be identical and defining the second and fourth nets to be identical.

16. The method of claim 10, further comprising configuring the programmable logic device to include the first and second delay elements in respective first and second oscillators.

17. The method of claim 16, further comprising comparing the periods of the first and second oscillators.

* * * * *